US008078454B2

(12) United States Patent
Pouzin

(10) Patent No.: US 8,078,454 B2
(45) Date of Patent: Dec. 13, 2011

(54) TWO-PASS HASH EXTRACTION OF TEXT STRINGS

(75) Inventor: Dominic Pouzin, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 1085 days.

(21) Appl. No.: 11/863,680

(22) Filed: Sep. 28, 2007

(65) Prior Publication Data

US 2009/0089048 A1    Apr. 2, 2009

(51) Int. Cl.
G06F 17/21 (2006.01)
G06F 7/00 (2006.01)
G06F 17/30 (2006.01)

(52) U.S. Cl. .......................................... 704/10; 707/747
(58) Field of Classification Search ....................... None
See application file for complete search history.

(56) References Cited

U.S. PATENT DOCUMENTS

| | | | | |
|---|---|---|---|---|
| 4,843,389 A * | 6/1989 | Lisle et al. | ..................... | 341/106 |
| 5,287,499 A * | 2/1994 | Nemes | ..................... | 1/1 |
| 5,333,313 A | 7/1994 | Heising | ......................... | 395/600 |
| 5,561,421 A | 10/1996 | Smith et al. | ..................... | 341/51 |
| 5,951,623 A | 9/1999 | Reynar et al. | .................. | 709/203 |
| 6,047,298 A | 4/2000 | Morishita | ......................... | 7/532 |
| 6,121,901 A | 9/2000 | Welch et al. | ..................... | 341/51 |
| 6,879,271 B2 | 4/2005 | Abdat | ............................. | 341/87 |
| 7,003,522 B1 | 2/2006 | Reynar et al. | .................. | 707/10 |
| 7,031,910 B2 | 4/2006 | Eisele | ............................ | 704/10 |
| 7,032,174 B2 | 4/2006 | Montero et al. | .............. | 715/533 |
| 7,181,388 B2 | 2/2007 | Tian | ................................ | 704/10 |
| 7,403,137 B1 * | 7/2008 | Huang | ............................. | 341/51 |
| 7,451,075 B2 * | 11/2008 | Mohammed | ...................... | 704/7 |
| 7,584,184 B2 * | 9/2009 | Takuma et al. | ........................ | 1/1 |
| 2003/0101413 A1 | 5/2003 | Klein et al. | .................... | 715/513 |
| 2003/0125929 A1 | 7/2003 | Bergstraesser et al. | ........... | 704/9 |
| 2004/0006547 A1 * | 1/2004 | Dehlinger et al. | ................. | 707/1 |
| 2005/0027731 A1 | 2/2005 | Revel | ............................ | 707/101 |
| 2008/0065639 A1 * | 3/2008 | Choudhary et al. | .............. | 707/7 |

FOREIGN PATENT DOCUMENTS

JP 2007-094838 A 4/2007
KR 10-2004-00117769 2/2004

OTHER PUBLICATIONS

International Search Report dated Mar. 24, 2009 cited in Application No. PCT/US2008/074586.

(Continued)

*Primary Examiner* — Matthew Sked
(74) *Attorney, Agent, or Firm* — Merchant & Gould

(57) ABSTRACT

Data compression and key word recognition may be provided. A first pass may walk a text string, generate terms, and calculate a hash value for each generated term. For each hash value, a hash bucket may be created where an associated occurrence count may be maintained. The hash buckets may be sorted by occurrence count and a few top buckets may be kept. Once those top buckets are known, a second pass may walk the text string, generate terms, and calculate a hash value for each term. If the hash values of terms match hash values of one of the kept buckets, then the term may be considered a frequent term. Consequently, the term may be added to a dictionary along with a corresponding frequency count. Then, the dictionary may be examined to remove terms that may not be frequent, but appeared due to hash collisions.

20 Claims, 6 Drawing Sheets

OTHER PUBLICATIONS

J. L. Martinez-Fernández et al., "Automatic Keyword Extraction for News Finder." 20 pgs., http://canada.esat.kuleuven.be/omnipaper/downloads/WP7_AKE_AMR_1.pdf.

Suzanne Bunton et al., "Practical Dictionary Management for Hardware Data Compression." Communications of the ACM. Jan. 1992, vol. 35, No. 1, pp. 95-104, http://delivery.acm.org/10.1145/130000/129622/p95-bunton.pdf?key1=129622&key2=6460113811&coli=GUIDE&d1=GUIDE&CFID=72243252&CFTOKEN=63873519.

"Smart Tags—Buttons with a Brain! Improve Productivity Within Your Office XP 2002/3 Documents!", 3 pgs. http://www.download3k.com/Press-Smart-Tags-Buttons-with-a-Brain-IMPROVE.html.

Chinese First Office Action dated Jun. 24, 2011 cited in Application No. 200880109407.0.

* cited by examiner

FIG. 5

```
Algorithm overview:                    500
// Declarations
Buckets      buckets;
Dictionary   dictionary;
Input        input;

// Pass0: build perfect hashing function (optional but guarantees
100% correct results and can save memory)
CalculatePerfectHashingFunction()

// Pass1: create hash buckets by hashing the input
GoToBeginning(input)
while (Term term : GenerateNextTerm(input))
        Hash hash : CalculateHash(term)
        Bucket bucket : FindBucketByHash(hash, buckets)
        if (!bucket)
                bucket : CreateBucket(buckets, hash)
        end if
        IncrementBucketCount(buckets, bucket)
end while // Sort buckets by occurrence count, and select top ones
SelectTopBuckets(buckets)

// Pass2: build a dictionary by hashing the input once again
GoToBeginning(input)
while (Term term : GenerateNextTerm(input))
        Hash hash : CalculateHash(term)
        Bucket bucket : FindBucketByHash(hash, buckets)
        if (bucket)
                Entry entry : FindEntryByTerm(term, dictionary)
                if (!entry)
                        entry : CreateEntry(dictionary, term);
                end if
                IncrementEntryCount(dictionary, entry)
        end if
end while // Repair collisions by removing terms that have a low occurrence
count (not required if Pass0 was performed)
EliminateLowCountEntries(dictionary)

// Rank dictionary terms by occurrence count, filter, prune, etc.
RankEntries(dictionary)
```

TWO-PASS HASH EXTRACTION OF TEXT STRINGS

BACKGROUND

In information theory, data compression or source coding is a process of encoding information using fewer bits than an unencoded representation would use through use of specific encoding schemes. For example, a text could be encoded with fewer bits if one were to accept the convention that the word "compression" be encoded as "comp." One conventional instance of compression with which many computer users are familiar is the "ZIP" file format, which, as well as providing compression, acts as an archiver, storing many files in a single output file.

As with any communication, compressed data communication only works when both the sender and receiver of the information understand the encoding scheme. For example, a text makes sense only if a receiver understands that it is intended to be interpreted as characters representing the English language. Similarly, compressed data can only be understood if the decoding method is known by the receiver.

Compression is useful because it helps reduce the consumption of expensive resources, such as memory or transmission bandwidth. On the downside, compressed data must be decompressed to be viewed (or heard). This extra decompression processing may be detrimental to some applications. For instance, a compression scheme for video may require expensive hardware for the video to be decompressed fast enough to be viewed as it is being decompressed (the option of decompressing the video in full before watching it may be inconvenient, and requires storage space for the decompressed video). Data compression schemes therefore involves trade-offs among various factors, including memory, the degree of compression, the amount of distortion introduced (if using a lossy compression scheme), and the computational resources required to compress and decompress the data.

SUMMARY

This Summary is provided to introduce a selection of concepts in a simplified form that are further described below in the Detailed Description. This Summary is not intended to identify key features or essential features of the claimed subject matter. Nor is this Summary intended to be used to limit the claimed subject matter's scope.

Data compression and key word recognition may be provided. A first pass may walk a text string, generate terms, and calculate a hash value for each generated term. For each hash value, a hash bucket may be created where an associated occurrence count may be maintained. The hash buckets may be sorted by occurrence count and a few top buckets may be kept. Once those top buckets are known, a second pass may walk the text string, generate terms, and calculate a hash value for each term. If the hash values of terms match hash values of one of the kept buckets, then the term may be considered a frequent term. Consequently, the term may be added to a dictionary along with a corresponding frequency count. Then, the dictionary may be examined to remove terms that may not be frequent, but appeared due to hash collisions.

Both the foregoing general description and the following detailed description provide examples and are explanatory only. Accordingly, the foregoing general description and the following detailed description should not be considered to be restrictive. Further, features or variations may be provided in addition to those set forth herein. For example, embodiments may be directed to various feature combinations and sub-combinations described in the detailed description.

BRIEF DESCRIPTION OF THE DRAWINGS

The accompanying drawings, which are incorporated in and constitute a part of this disclosure, illustrate various embodiments of the present invention. In the drawings:

FIG. 5 illustrates an algorithm.

DETAILED DESCRIPTION

Figure 1:
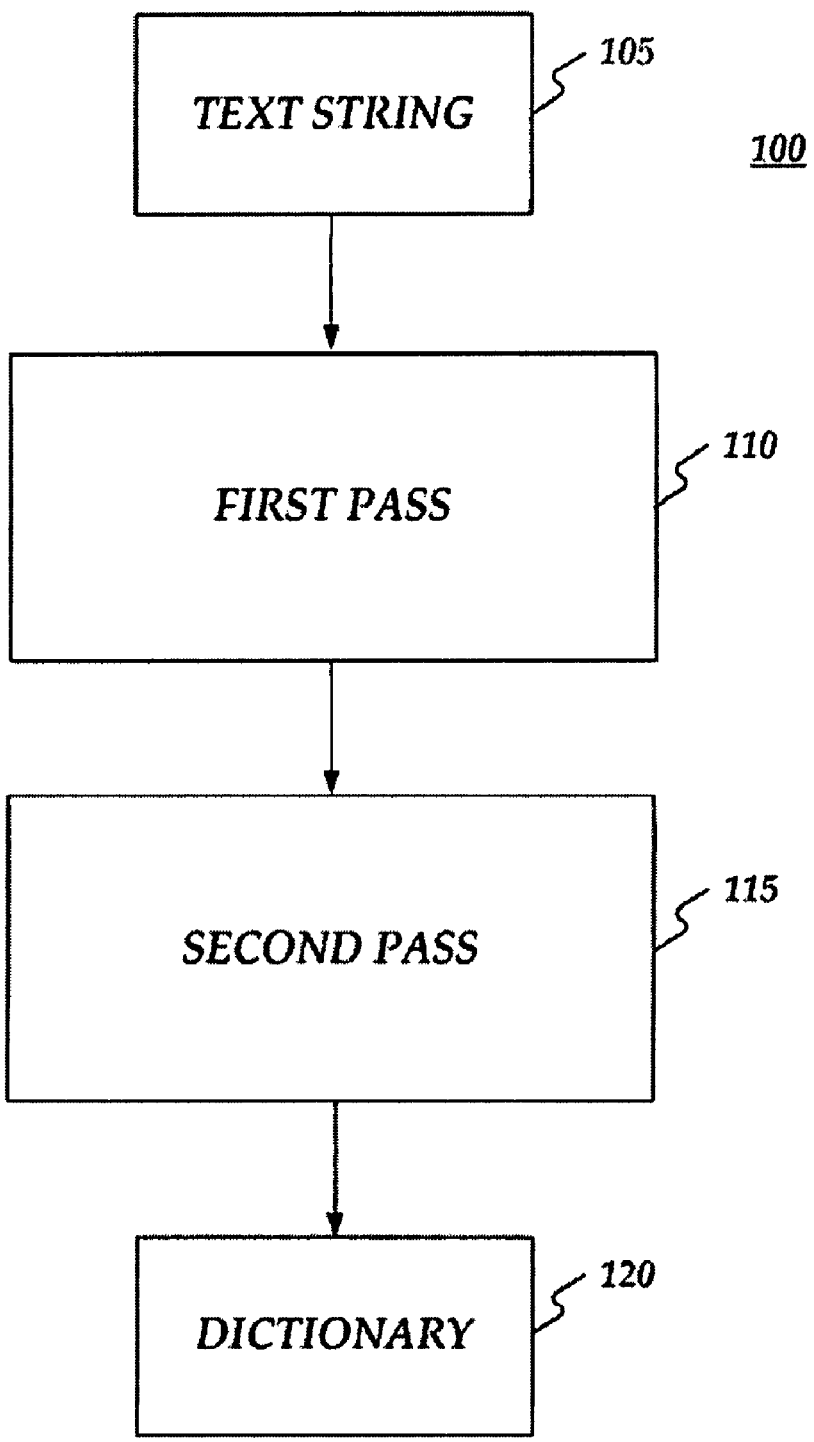
FIG. 1 is a block diagram of an operating environment.

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

Consistent with embodiments of the invention, a two-pass hash based algorithm may be used for discovering frequent terms in a document (e.g. a text string). In addition, memory quality vs. memory vs. runtime may be controlled. Embodiments of the invention may find, for example, the most frequent 100 keywords along with their count in a 1.68 meg document with a 1% error miss rate taking 1.5 seconds while keeping memory under 3 KBs.

An algorithm described below, for example, may discover frequent keywords in a text string. Consider a text string containing the following text: "I went to the market but the market was closed." Embodiments of the invention may discover that "market" and "the" may be frequent terms that may qualify as keywords. However, embodiments of the invention may also be used for compression purposes. Consider a text string containing the following text: "abracadabra, abrasive brats!". Embodiments of the invention may discover that "bra" is a frequent term that may be worth compressing. Regardless, a goal of embodiments of the invention may be to discover frequent repeat terms. Another goal may be to produce a document summary, to highlight terms of importance, to compress document data, to find excessive grammatical repetitions, etc. in other words, embodiments of the invention may find frequent terms in a text string, be they keywords or even substrings within strings. In addition, embodiments of the invention may determine how many times each frequent term appears in the text string and may control memory usage, runtime execution, and result quality.

Conventional compression algorithms are designed for compress-and-store purposes. Thus conventional systems can make lookups expensive, or sometimes impossible without full decompression. Consistent with embodiments of the invention, the aforementioned two-pass hash based algorithm may implement lightweight compression, making quick lookups possible. Consider the following scenario for example. We may have a long list of accounts/contacts:

John Doe
John Wayne
Wayne Smith
...

When the user types in some text (call this the input), we may quickly identify the accounts/contacts above, and highlight them.

ZIP may be used to compress the list. While the list may be compressed very efficiently, there may be no way to perform quick lookups. Because ZIP compression may be adaptive, we may not hope to compress the input and search for matching bytes in the compressed list. Decompressing the list to compare with the input may defeat the whole purpose as well.

If the aforementioned two-pass hash based algorithm is run to find the most frequent two symbols (e.g. also weighing the length of the string and the cost of encoding to find the "best" two symbols to compress.) We may end up with a compact list after lightweight compression:

$1=John
$2=Wayne
$1 Doe
$1 $2
$2 Smith
...

Because we may control how many symbols are encoded, we may replace those symbols in the input and compare.

The following is another example with XML. For example, we may have a large XML document containing:

```
<Greetings>
    <Word id="Welcome">English</Word>
    <Word id="Bonjour">French</Word>
    <Word id="Danke">German</Word>
    ...
</Greetings>
```

We may want to be able to use less memory to hold the XML document but still be able to use XPath queries for lookups: XPath=Greetings/Word[@id="Welcome"].

We may use ZIP to compress the XML document. XPath may just not work (because we have compressed bytes, not an XML document any more.) Now if we run the aforementioned two-pass hash based algorithm to find the most frequent two symbols (e.g. avoiding to encode certain XML nodes or attributes may be used to find the "best" two symbols to compress.) We may end up with a compact XML document after lightweight compression:

```
$1=Greetings
$2=Word
<$1>
    <$2 id="Welcome">English<$2>
    <$2 id="Bonjour">French<$2>
    <$2 id="Danke">German<$2>
    ...
</$1>
```

Now we may continue to run XPath queries: XPath=$1/$2[@id="Welcome"]

FIG. 1 shows a recognition system 100 consistent with embodiments of the invention. As shown in FIG. 1, a text string 105 may be operated upon by a first pass 110 and a second pass 115 to produce a dictionary 120. For example, first pass 110 may walk text string 105, generate terms, and calculate a hash value for each generated term. For each hash value, a hash bucket may be created where an associated occurrence count may be maintained. The hash buckets may be sorted by occurrence count and a few top buckets may be kept. Once those top buckets are known, second pass 115 may walk text string 105 once again, generate terms, and again calculate a hash value for each term. If the hash values of terms match hash values of one of the kept buckets, then there may be a good probability that the term is a frequent term. Consequently, the term may be added to dictionary 120 along with a corresponding frequency count. Then, dictionary 120 may be examined to remove terms that may not be frequent, but appeared due to hash collisions. Next, terms in dictionary 120 may be ranked, pruned, and filtered. An example of an algorithm 500 for implementing the aforementioned two-pass process is shown in FIG. 5.

Figure 2:
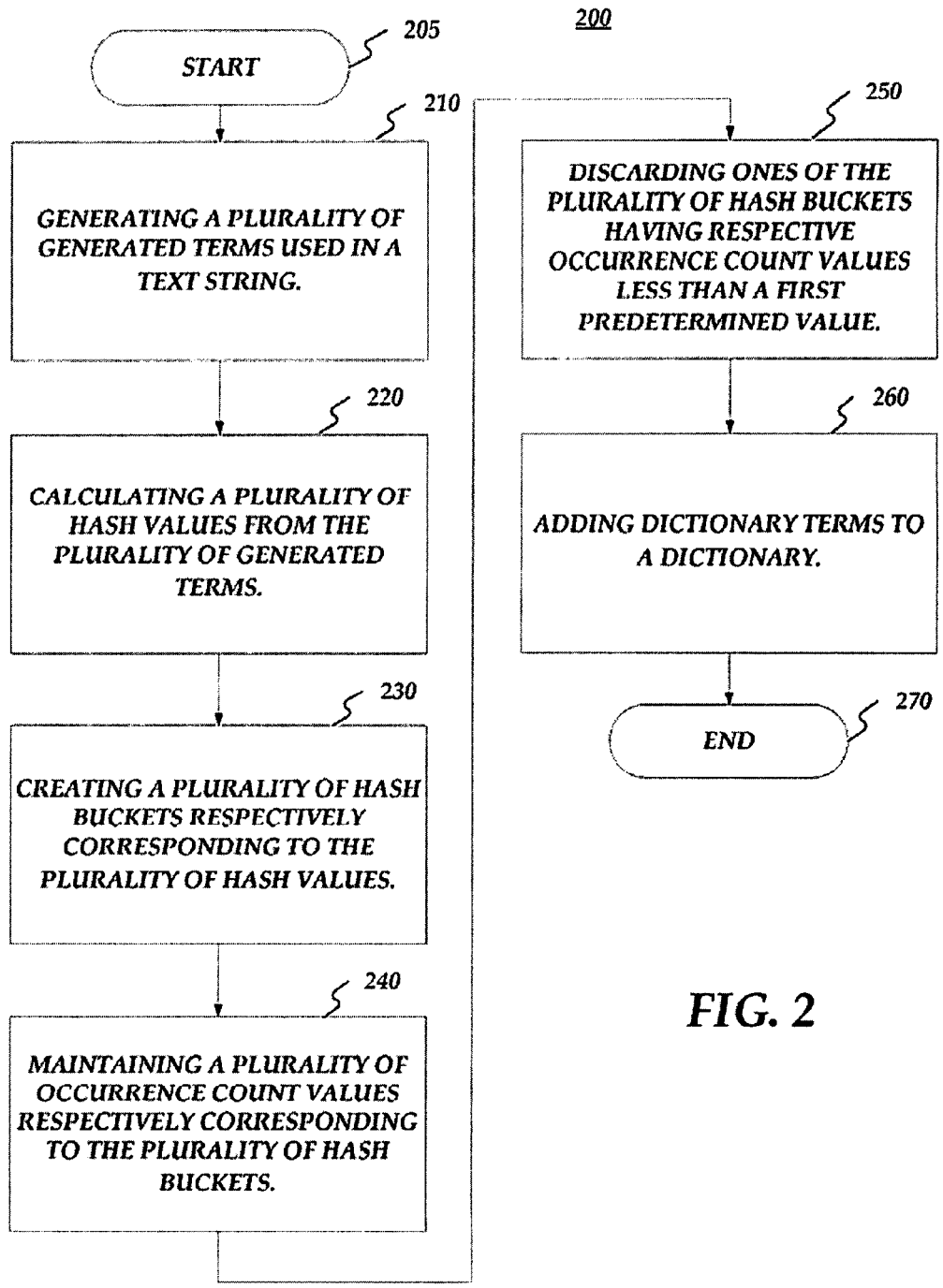
FIG. 2 is a flow chart of a method for recognizing text.
Figure 3:
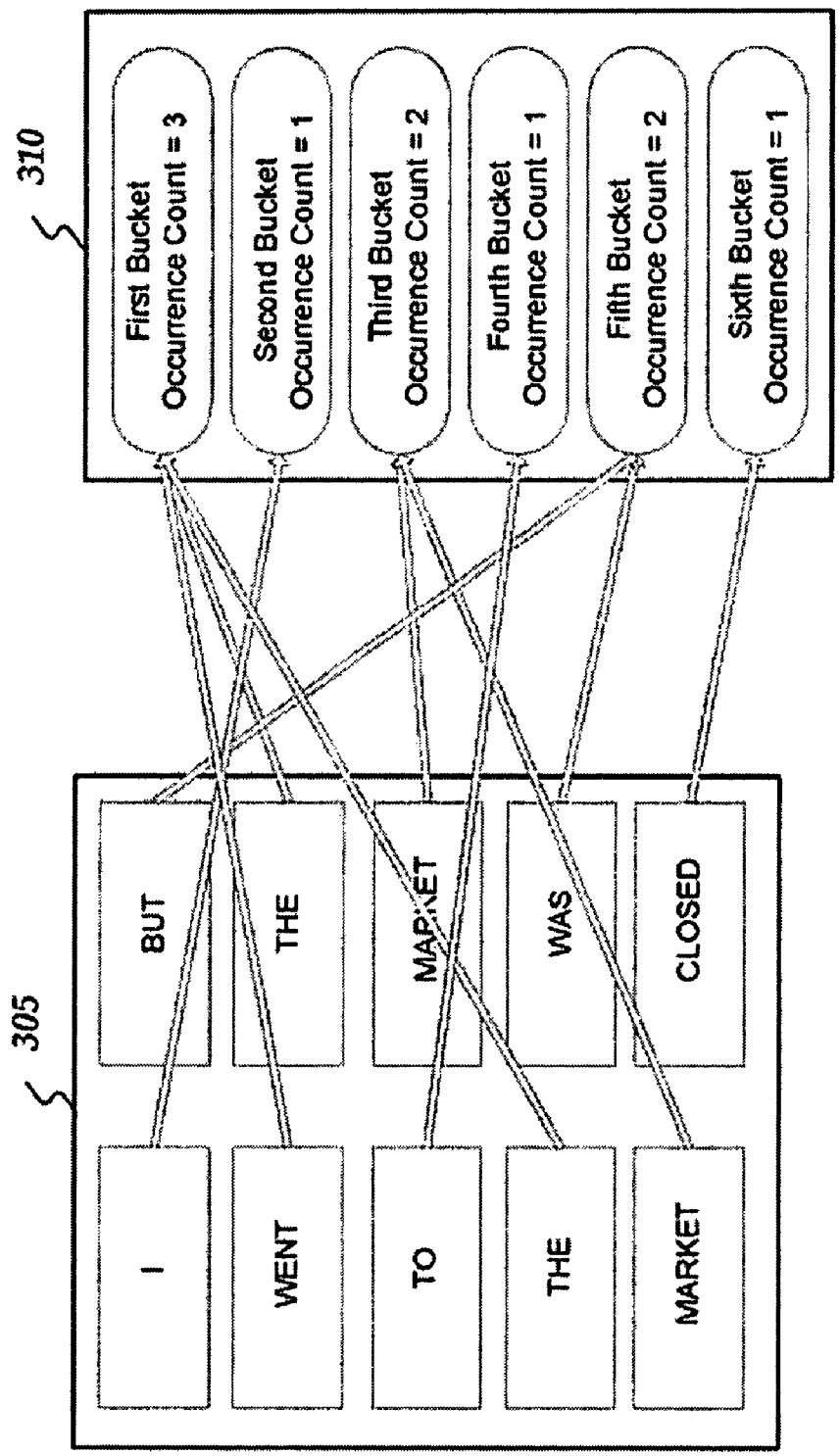
FIG. 3 is a block diagram of a first pass.

FIG. 2 is a flow chart setting forth the general stages involved in a method 200 consistent with an embodiment of the invention for recognizing text. Method 200 may be implemented using a computing device 600 as described in more detail below with respect to FIG. 6. Ways to implement the stages of method 200 will be described in greater detail below. Method 200 may begin at starting block 205 and proceed to stage 210 where computing device 600 may generate a plurality of generated terms used in text string 105. For example, first pass 110 may analyze text string 105 comprising "I went to the market but the market was closed." This analysis may generate a plurality of generated terms 305 comprising "I", "went", "to", "the", "market", "but", "the", "market", "was", and "closed" as shown in FIG. 3.

Consistent with embodiments of the invention, prefix/suffix terms may be generated, for example, for data compression purposes. For example, the term "abra" could generate prefix/suffix terms such as: "abra", "bra", "ra", "abr", etc. However, if finding frequent keywords in text string 105 is the purpose, there may be no need to generate prefixes/suffixes, rather individual strings from text string 105 may be generated.

From stage 210, where computing device 600 generates plurality of generated terms 305 used in text string 105, method 200 may advance to stage 220 where computing device 600 may calculate a plurality of hash values from plurality of generated terms 305. A hash string algorithm may be used to generate hashes as shown below.

```
private static int GetHash(string input)
{
    int hash = 0;
    for (int i = 0; i < input.Length; i++)
    {
        hash = (hash << 5) + hash + input[i];
    }
    return hash;
}
```

A perfect hash function may be used to avoid "collisions." Collisions are where two different terms may result in the same hash value. A perfect hash function of a set S is a hash function that may map different keys (elements) in S to different numbers. A perfect hash function with values in a range of size some constant times the number of elements in S can be used for efficient lookup operations, by placing the keys in a hash table according to the values of the perfect hash function.

A perfect hash function for a specific set S that can be evaluated in constant time, and with values in a small range, can be found by a randomized algorithm in a number of operations that is proportional to the size of S. The minimal size of the description of a perfect hash function may depend on the range of its function values: the smaller the range, the more space is required. Any perfect hash functions suitable for use with a hash table may require at least a number of bits that is proportional to the size of S. Many implementations may require a number of bits that is proportional to n log(n), where n is the size of S. This may mean that space for storing the perfect hash function can be comparable to the space for storing the set.

Using a perfect hash function may be best in situations where there is a large set that is not updated frequently, and many lookups into it. Efficient solutions to performing updates are known as dynamic perfect hashing, but these methods are relatively complicated to implement A simple alternative to perfect hashing, which also allows dynamic updates, may be "cuckoo hashing."

Moreover, a minimal perfect hash may be used. A minimal perfect hash function may be a perfect hash function that maps n keys to n consecutive integers—usually [0.n−1] or [1.n]. A more formal way of expressing this is: Let j and k be elements of some set K. F is a minimal perfect hash function iff F(j)=F(k) implies j=k and there exists an integer a such that the range of F is a.a+|K|−1. A minimal perfect hash function F may be order-preserving if for any keys j and k, j<k implies F(j)<F(k). Not withstanding, different algorithms based on graph theory/probabilities may be used to generate perfect hashing functions (e.g. the CHM minimal perfect hashing algorithm). This may however require a first initial pass (e.g. labeled Pass0 in algorithm 500 shown in FIG. 5) whose runtime may grow linearly with the input size.

Once computing device 600 calculates the plurality of hash values from the plurality of generated terms in stage 220, method 200 may continue to stage 230 where computing device 600 may create a plurality of hash buckets respectively corresponding to the plurality of hash values. For example, first pass 110 may create a plurality of hash buckets 310. As shown in FIG. 3, plurality of hash buckets 310 may comprise a first bucket, a second bucket, a third bucket, a fourth bucket, a fifth bucket, and a sixth bucket.

After computing device 600 creates plurality of hash buckets 310 in stage 230, method 200 may proceed to stage 240 where computing device 600 may maintain a plurality of occurrence count values respectively corresponding to plurality of hash buckets 310. Each of the plurality of occurrence count values may respectively indicate a number of times ones of the plurality of generated terms (e.g. plurality of generated terms 305) occur in text string 105 having a hash value that respectively correspond to the plurality of occurrence count values' respective hash bucket. For example, as shown in FIG. 3, first pass 110 may scan text string 105 and compute the hash of generated terms 305. The two instances of "market" in generated terms 305 may be hashed to the third bucket, contributing to an occurrence count of 2 for the third bucket. Moreover, the two instances of "the" in generated terms 305 may be hashed to the first bucket. However, "went" may also hashed to the first bucket due to collisions, contributing to an occurrence count of 3 for the first bucket. In any case, finding more instances of the same term in the plurality of generated terms may reinforce the count of a particular hash bucket.

From stage 240, where computing device 600 maintains the plurality of occurrence count values, method 200 may advance to stage 250 where computing device 600 may discard ones of the plurality of hash buckets having respective occurrence count values less than a first predetermined value. For example, the first predetermined value may comprise "3."

Figure 4:
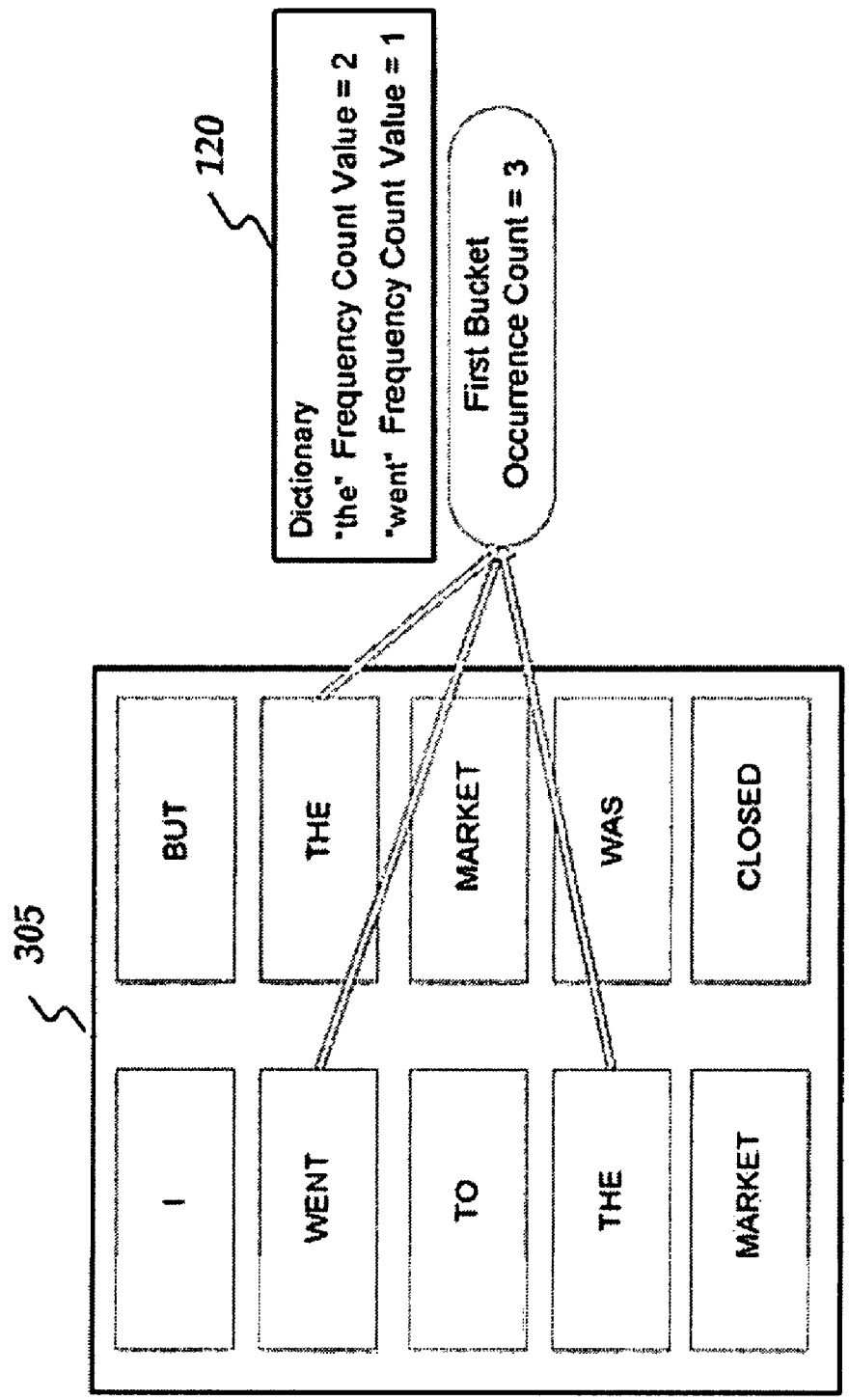
FIG. 4 is a block diagram of a second pass.

Consequently, in the FIG. 3 example, second bucket, third bucket, fourth bucket, fifth bucket, and sixth bucket may all be discarded because each of these hash buckets has an occurrence count of less than "3" leading to the example shown in FIG. 4. While FIG. 4's example shows only one kept hash bucket, the top N hash buckets, or all hash buckets with a count greater than a defined threshold (e.g. first predetermined value) may be kept. In other words, the top N buckets having the highest occurrence count values may be kept, not just buckets whose occurrence count values are greater than X for example.

Once computing device 600 discards ones of the plurality of hash buckets in stage 250, method 200 may continue to stage 260 where computing device 600 may add dictionary terms to dictionary 120. The dictionary terms may comprise ones of the plurality of generated terms having respective hash values corresponding to any of the plurality of hash values respectively corresponding to the remaining plurality of hash buckets. Dictionary 120 may also include a plurality of frequency count values respectively indicating the number of times each of the dictionary terms occurred in text string 104. For example, as shown in FIG. 4, second pass 115 may re-scan text string 105 and compute the hash of the generated terms. If the hash matches that of a kept bucket (e.g. the first bucket), then the term may be added to dictionary 120 along with a corresponding frequency count value. Otherwise the term may be discarded. As shown in FIG. 4, dictionary 120 may contain terms "the" (frequency count value=2) and "went" (frequency count value=1). If text string 105 had been larger, second pass 115 may have produced a much higher frequency count value for "the" and a smaller frequency count value for "went."

Consistent with embodiments of the invention, second pass 115 may remove noise due to collisions and rank terms in dictionary 120. For example, "went" was hashed to the same bucket as "the". However the final count obtained during second pass 115 may reveal that "went" is not that frequent and can be removed from dictionary 120. Accordingly, collisions may be repaired.

Moreover, dictionary terms may be ranked using an evaluation function that depends on a goal (e.g. data compression, keyword detection, etc.). For example, if the goal is data compression, then a rank may be assigned to a frequent dictionary term based on its string length multiplied by its frequency count value minus the cost of coding this information (i.e. the "benefit" of compressing a frequent dictionary term). In another example, if the goal is to find keywords in a text string, then a rank may be assigned to frequent dictionary terms based on their significance. For example, in English, a frequent "the" term may not be ranked high because it is treated as noise. Accordingly, ranking processes may vary depending on the goal. Once computing device 600 adds the dictionary terms to the dictionary in stage 260, method 200 may then end at stage 270.

An embodiment consistent with the invention may comprise a system for recognizing text. The system may comprise a memory storage and a processing unit coupled to the memory storage. The processing unit may be operative to generate a plurality of generated terms used in a text string, calculate a plurality of hash values from the plurality of generated terms, and create a plurality of hash buckets respectively corresponding to the plurality of hash values. In addition, the processing unit may be operative to maintain a plurality of occurrence count values respectively corresponding to the plurality of hash buckets. Each of the plurality of occurrence count values may respectively indicate a number of times ones of the plurality of generated terms occur in the text string having a hash value that respectively correspond to the plurality of occurrence count values' respective hash bucket. Moreover, the processing unit may be operative to discard ones of the plurality of hash buckets having respective occurrence count values less than a first predetermined value. Furthermore, the processing unit may be operative to add dictionary terms to a dictionary. The dictionary terms may comprise ones of the plurality of generated terms having respective hash values corresponding to any of the plurality of hash values respectively corresponding to the remaining plurality of hash buckets. The dictionary may include a plurality of frequency count values respectively indicating the number of times each of the dictionary terms occurred in the text string.

Another embodiment consistent with the invention may comprise a system for recognizing text. The system may comprise a memory storage and a processing unit coupled to the memory storage. The processing unit may be operative to create a plurality of hash buckets respectively corresponding to a plurality of hash values corresponding to a plurality of generated terms in a text string wherein at least a portion of the plurality of generated terms comprise sub-strings. In addition, the processing unit may be operative to maintain a plurality of occurrence count values respectively corresponding to the plurality of hash buckets. Each of the plurality of occurrence count values may respectively indicate a number of times ones of the plurality of generated terms occur in the text string having a hash value that respectively correspond to the plurality of occurrence count values' respective hash bucket. Moreover, the processing unit may be operative to discard ones of the plurality of hash buckets having respective occurrence count values less than a first predetermined value. Also, the processing unit may be operative to add dictionary terms to a dictionary. The dictionary terms may comprise ones of the plurality of generated terms having respective hash values corresponding to any of the plurality of hash values respectively corresponding to the remaining plurality of hash buckets. The dictionary may include a plurality of frequency count values respectively indicating the number of times each of the dictionary terms occurred in the text string. Furthermore, the processing unit may be operative to rank the dictionary terms using an evaluation function configured for data compression wherein the dictionary terms may be ranked based upon a plurality respective indexes respectively corresponding to each of the dictionary terms. Each of the plurality indexes may respectively comprise the frequency count value of each respective dictionary term multiplied by a length of each respective dictionary term.

Yet another embodiment consistent with the invention may comprise a system for recognizing text. The system may comprise a memory storage and a processing unit coupled to the memory storage. The processing unit may be operative to create a plurality of hash buckets respectively corresponding to a plurality of hash values corresponding to a plurality of generated terms in a text string wherein each of the plurality of generated terms comprise individual strings. In addition, the processing unit may be operative to maintain a plurality of occurrence count values respectively corresponding to the plurality of hash buckets. Each of the plurality of occurrence count values may respectively indicate a number of times ones of the plurality of generated terms occur in the text string having a hash value that respectively correspond to the plurality of occurrence count values' respective hash bucket. Also, the processing unit may be operative to discard ones of the plurality of hash buckets having respective occurrence count values less than a first predetermined value and to add dictionary terms to a dictionary. The dictionary terms may comprise ones of the plurality of generated terms having respective hash values corresponding to any of the plurality of hash values respectively corresponding to the remaining plurality of hash buckets. The dictionary may include a plurality of frequency count values respectively indicating the number of times each of the dictionary terms occurred in the text string. Furthermore, the processing unit may be operative to rank the dictionary terms using an evaluation function configured for keyword recognition wherein the dictionary terms are ranked based upon their respective frequency count values.

Figure 6:
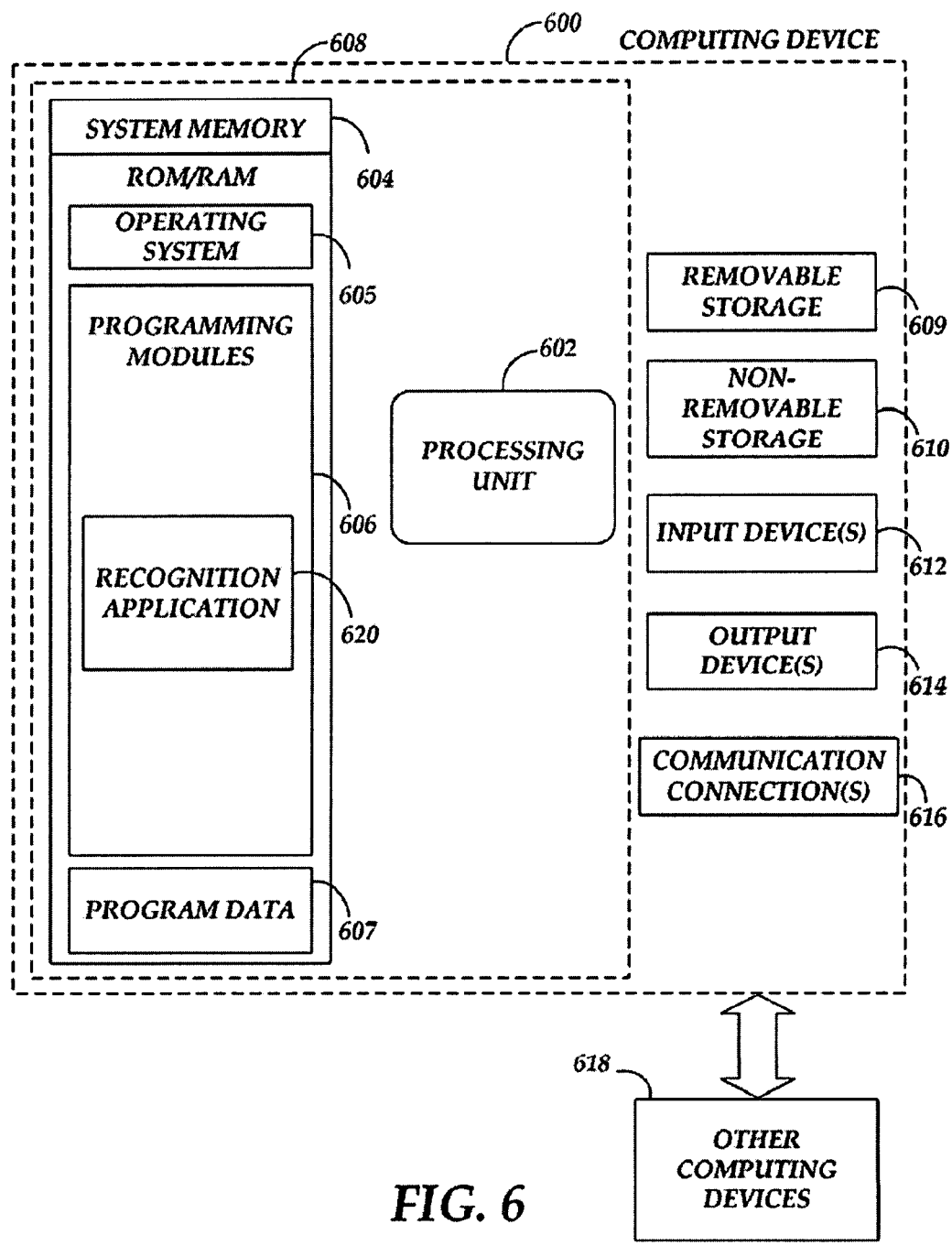
FIG. 6 is a block diagram of a system including a computing device.

FIG. 6 is a block diagram of a system including computing device 600. Consistent with an embodiment of the invention, the aforementioned memory storage and processing unit may be implemented in a computing device, such as computing device 600 of FIG. 6. Any suitable combination of hardware, software, or firmware may be used to implement the memory storage and processing unit. For example, the memory storage and processing unit may be implemented with computing device 600 or any of other computing devices 618, in combination with computing device 600. The aforementioned system, device, and processors are examples and other systems, devices, and processors may comprise the aforementioned memory storage and processing unit, consistent with embodiments of the invention. Furthermore, computing device 600 may comprise an operating environment for system 100 as described above. System 100 may operate in other environments and is not limited to computing device 600.

With reference to FIG. 6, a system consistent with an embodiment of the invention may include a computing device, such as computing device 600. In a basic configuration, computing device 600 may include at least one processing unit 602 and a system memory 604. Depending on the configuration and type of computing device, system memory 604 may comprise, but is not limited to, volatile (e.g. random access memory (RAM)), non-volatile (e.g. read-only memory (ROM)), flash memory, or any combination. System memory 604 may include operating system 605, one or more programming modules 606, and may include a program data 607. Operating system 605, for example, may be suitable for controlling computing device 600's operation. In one embodiment, programming modules 606 may include, for example, a recognition application 620. Furthermore, embodiments of the invention may be practiced in conjunction with a graphics library, other operating systems, or any other application program and is not limited to any particular application or system. This basic configuration is illustrated in FIG. 6 by those components within a dashed line 608.

Computing device 600 may have additional features or functionality. For example, computing device 600 may also include additional data storage devices (removable and/or nonremovable) such as, for example, magnetic disks, optical disks, or tape. Such additional storage is illustrated in FIG. 6 by a removable storage 609 and a non-removable storage 610. Computer storage media may include volatile and nonvolatile, removable and non-removable media implemented in any method or technology for storage of information, such as computer readable instructions, data structures, program modules, or other data. System memory 604, removable storage 609, and non-removable storage 610 are all computer storage media examples (i.e. memory storage). Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 600. Any such computer storage media may be part of device 600. Computing device 600 may also have input device(s) 612 such as a keyboard, a mouse, a pen, a sound input device, a touch input device, etc. Output device(s) 614 such as a display, speakers, a printer, etc. may also be included. The aforementioned devices are examples and others may be used.

Computing device 600 may also contain a communication connection 616 that may allow device 600 to communicate with other computing devices 618, such as over a network in a distributed computing environment, for example, an intranet or the Internet. Communication connection 616 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both storage media and communication media.

As stated above, a number of program modules and data files may be stored in system memory 604, including operating system 605. While executing on processing unit 602, programming modules 606 (e.g. recognition application 620) may perform processes including, for example, one or more method 200's stages as described above. The aforementioned process is an example, and processing unit 602 may perform other processes. Other programming modules that may be used in accordance with embodiments of the present invention may include electronic mail and contacts applications, word processing applications, spreadsheet applications, database applications, slide presentation applications, drawing or computer-aided application programs, etc.

Generally, consistent with embodiments of the invention, program modules may include routines, programs, components, data structures, and other types of structures that may perform particular tasks or that may implement particular abstract data types. Moreover, embodiments of the invention may be practiced with other computer system configurations, including hand-held devices, multiprocessor systems, microprocessor-based or programmable consumer electronics, minicomputers, mainframe computers, and the like. Embodiments of the invention may also be practiced in distributed computing environments where tasks are performed by remote processing devices that are linked through a communications network. In a distributed computing environment, program modules may be located in both local and remote memory storage devices.

Furthermore, embodiments of the invention may be practiced in an electrical circuit comprising discrete electronic elements, packaged or integrated electronic chips containing logic gates, a circuit utilizing a microprocessor, or on a single chip containing electronic elements or microprocessors. Embodiments of the invention may also be practiced using other technologies capable of performing logical operations such as, for example, AND, OR, and NOT, including but not limited to mechanical, optical, fluidic, and quantum technologies. In addition, embodiments of the invention may be practiced within a general purpose computer or in any other circuits or systems.

Embodiments of the invention, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present invention may be embodied in hardware and/or in software (including firmware, resident software, micro-code, etc.). In other words, embodiments of the present invention may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present invention, for example, are described above with reference to block diagrams and/or operational illustrations of methods, systems, and computer program products according to embodiments of the invention. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the invention have been described, other embodiments may exist. Furthermore, although embodiments of the present invention have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the invention.

All rights including copyrights in the code included herein are vested in and the property of the Applicant The Applicant retains and reserves all rights in the code included herein, and grants permission to reproduce the material only in connection with reproduction of the granted patent and for no other purpose.

While the specification includes examples, the invention's scope is indicated by the following claims. Furthermore, while the specification has been described in language specific to structural features and/or methodological acts, the claims are not limited to the features or acts described above. Rather, the specific features and acts described above are disclosed as example for embodiments of the invention.

What is claimed is:

1. A method for recognizing text, the method comprising:
    generating a plurality of generated terms used in a text string;
    calculating, by a calculating device, a plurality of hash values from the plurality of generated terms;
    creating a plurality of hash buckets respectively corresponding to the plurality of hash values;
    maintaining a plurality of occurrence count values respectively corresponding to the plurality of hash buckets, each of the plurality of occurrence count values respectively indicating a number of times ones of the plurality of generated terms occur in the text string having a hash value that respectively correspond to the plurality of occurrence count values' respective hash bucket;
    discarding ones of the plurality of hash buckets having respective occurrence count values less than a first predetermined value;
    adding dictionary terms to a dictionary, the dictionary terms comprising ones of the plurality of generated terms having respective hash values corresponding to any of the plurality of hash values respectively corresponding to the remaining plurality of hash buckets, the dictionary including a plurality of frequency count values respectively indicating the number of times each of the dictionary terms occurred in the text string; and
    removing at least one dictionary term that was added to the dictionary due to hash collisions.

2. The method of claim 1, further comprising ranking the dictionary terms.

3. The method of claim 1, further comprising ranking the dictionary terms using an evaluation function.

4. The method of claim 1, further comprising ranking the dictionary terms using an evaluation function configured for data compression.

5. The method of claim 1, further comprising ranking the dictionary terms using an evaluation function configured for data compression wherein the dictionary terms are ranked based upon a plurality respective indexes respectively corresponding to each of the dictionary terms, each of the plurality indexes respectively comprising the frequency count value of each respective dictionary term multiplied by a length of each respective dictionary term.

6. The method of claim 1, further comprising ranking the dictionary terms using an evaluation function configured for keyword recognition.

7. The method of claim 1, further comprising ranking the dictionary terms using an evaluation function configured for keyword recognition wherein the dictionary terms are ranked based upon their respective frequency count values.

8. The method of claim 1, further comprising using the dictionary to determine which of the generated terms to compress in the text string.

9. The method of claim 1, further comprising using the dictionary to determine which of the generated terms to characterize as keywords.

10. The method of claim 1, further comprising removing dictionary terms from the dictionary that have corresponding frequency count values less than a second predetermined value.

11. The method of claim 1, wherein generating the plurality of generated terms used in the text string comprises generating the plurality of generated terms used in the text string wherein each of the plurality of generated terms comprise individual strings.

12. The method of claim 1, wherein generating the plurality of generated terms used in the text string comprises generating the plurality of generated terms used in the text string wherein at least a portion of the plurality of generated terms comprise sub-strings.

13. The method of claim 1, wherein calculating the plurality of hash values from the plurality of generated terms comprises calculating the plurality of hash values based upon a perfect hash algorithm.

14. A computer-readable storage medium which stores a set of instructions which when executed performs a method for recognizing text, the method executed by the set of instructions comprising:
    creating a plurality of hash buckets respectively corresponding to a plurality of hash values corresponding to a plurality of generated terms in a text string wherein at least a portion of the plurality of generated terms comprise sub-strings;
    maintaining a plurality of occurrence count values respectively corresponding to the plurality of hash buckets, each of the plurality of occurrence count values respectively indicating a number of times ones of the plurality of generated terms occur in the text string having a hash value that respectively correspond to the plurality of occurrence count values' respective hash bucket;
    discarding ones of the plurality of hash buckets having respective occurrence count values less than a first predetermined value;
    adding dictionary terms to a dictionary, the dictionary terms comprising ones of the plurality of generated terms having respective hash values corresponding to any of the plurality of hash values respectively corresponding to the remaining plurality of hash buckets, the dictionary including a plurality of frequency count values respectively indicating the number of times each of the dictionary terms occurred in the text string;
    removing at least one dictionary term that was added to the dictionary due to hash collisions, the at least one dictionary term not being a frequent term; and
    ranking the dictionary terms using an evaluation function configured for data compression wherein the dictionary terms are ranked based upon a plurality respective indexes respectively corresponding to each of the dictionary terms, each of the plurality indexes respectively comprising the frequency count value of each respective dictionary term multiplied by a length of each respective dictionary term.

15. The computer-readable storage medium of claim 14, further comprising using the dictionary to determine which of the generated terms to compress in the text string.

16. The computer-readable storage medium of claim 14, further comprising removing dictionary terms from the dictionary that have corresponding frequency count values less than a second predetermined value.

17. The computer-readable storage medium of claim 14, further comprising calculating the plurality of hash values based upon a perfect hash algorithm.

18. A system for recognizing text, the system comprising:
a memory storage: and
a processing unit coupled to the memory storage, wherein the processing unit is operative to:
- create a plurality of hash buckets respectively corresponding to a plurality of hash values corresponding to a plurality of generated terms in a text string wherein each of the plurality of generated terms comprise individual strings;
- maintain a plurality of occurrence count values respectively corresponding to the plurality of hash buckets, each of the plurality of occurrence count values respectively indicating a number of times ones of the plurality of generated terms occur in the text string having a hash value that respectively correspond to the plurality of occurrence count values' respective hash bucket;
- discard ones of the plurality of hash buckets having respective occurrence count values less than a first predetermined value;
- add dictionary terms to a dictionary, the dictionary terms comprising ones of the plurality of generated terms having respective hash values corresponding to any of the plurality of hash values respectively corresponding to the remaining plurality of hash buckets, the dictionary including a plurality of frequency count values respectively indicating the number of times each of the dictionary terms occurred in the text string;
- removing at least on dictionary term that was added to the dictionary due to hash collisions, the at least one dictionary term not being a frequent term; and
- rank the dictionary terms using an evaluation function configured for keyword recognition wherein the dictionary terms are ranked based upon their respective frequency count values.

19. The system of claim 18, wherein the processing unit is further operative to remove dictionary terms from the dictionary that have corresponding frequency count values less than a second predetermined value.

20. The system of claim 18, wherein the processing unit is further operative to calculate the plurality of hash values based upon a perfect hash algorithm.

* * * * *

UNITED STATES PATENT AND TRADEMARK OFFICE
CERTIFICATE OF CORRECTION

PATENT NO. : 8,078,454 B2  
APPLICATION NO. : 11/863680  
DATED : December 13, 2011  
INVENTOR(S) : Dominic Pouzin Page 1 of 1

It is certified that error appears in the above-identified patent and that said Letters Patent is hereby corrected as shown below:

In column 13, line 2, in Claim 18, delete "storage:" and insert -- storage; --, therefor.

In column 14, line 8, in Claim 18, delete "on" and insert -- one --, therefor.

Signed and Sealed this
Twenty-first Day of February, 2012

David J. Kappos
*Director of the United States Patent and Trademark Office*